United States Patent
Shiga (10) Patent No.: US 7,598,548 B2
(45) Date of Patent: Oct. 6, 2009

(54) SEMICONDUCTOR DEVICE AND FIELD-EFFECT TRANSISTOR

(75) Inventor: Toshihiko Shiga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 479 days.

(21) Appl. No.: 11/290,603

(22) Filed: Dec. 1, 2005

(65) Prior Publication Data

US 2006/0145201 A1 Jul. 6, 2006

(30) Foreign Application Priority Data

Jan. 5, 2005 (JP) .............................. 2005-000481

(51) Int. Cl.
*H01L 31/112* (2006.01)

(52) U.S. Cl. .............. 257/280; 257/E29.317; 257/613

(58) Field of Classification Search ............. 257/16, 257/103, 104, 280, 192, 472, 473, 483, E33.027, 257/485, 613, E29.317, E21.173
See application file for complete search history.

(56) References Cited

U.S. PATENT DOCUMENTS

| | | | | |
|---|---|---|---|---|
| 5,597,744 | A | * | 1/1997 | Kamiyama et al. .......... 438/285 |
| 6,013,576 | A | * | 1/2000 | Oh et al. ..................... 438/648 |
| 6,139,624 | A | * | 10/2000 | Rupp ............................ 117/2 |
| 6,521,998 | B1 | | 2/2003 | Teraguchi et al. |
| 7,034,330 | B2 | * | 4/2006 | Udagawa ..................... 257/16 |
| 7,105,907 | B2 | * | 9/2006 | Ikeda et al. ................. 257/473 |
| 7,112,860 | B2 | * | 9/2006 | Saxler ......................... 257/416 |
| 2003/0173574 | A1 | * | 9/2003 | Koide et al. .................. 257/94 |
| 2004/0222499 | A1 | | 11/2004 | Shibata et al. |
| 2005/0236643 | A1 | * | 10/2005 | Nakagawa et al. .......... 257/103 |
| 2007/0221946 | A1 | * | 9/2007 | Udagawa .................... 257/103 |

FOREIGN PATENT DOCUMENTS

| | | |
|---|---|---|
| JP | 08-064802 | 3/1996 |
| JP | 2000-196109 | 7/2000 |
| JP | 2001-274459 | 10/2001 |
| WO | WO 96/32739 | 10/1996 |

OTHER PUBLICATIONS

Yamamoto et al., "Properties of nano-multilayered hard coatings deposited by a new hybrid coating process," Surface & Coatings Technology 200 (2005) 435-439.*

Lee et al., "Characterization of tantalum nitride films deposited by reactive sputtering of Ta in N2/Ar gas mixtures," Materials Chemistry and Physics 68 (2001) 266-271.*

* cited by examiner

*Primary Examiner*—Thomas L Dickey
*Assistant Examiner*—Fazli Erdem
(74) *Attorney, Agent, or Firm*—Leydig, Voit & Mayer, Ltd.

(57) ABSTRACT

A Schottky electrode including a WNx layer on an n-type GaN layer. A crystal plane of the n-type GaN layer is in contact with a crystal plane of the WNx layer. The crystal plane of the n-type GaN layer is a (0001)-plane, and the crystal plane of the WNx layer is (111)-oriented. The WNx layer may be an electrode layer having an NaCl-type structure including at least one metal selected from the group consisting of zirconium, hafnium, niobium, tantalum, molybdenum and tungsten, and at least one element selected from nitrogen and carbon. Further, the lattice constant of the electrode layer is preferably 0.95 to 1.05 times the a-axis lattice constant of the n-type GaN layer, multiplied by $2^{(1/2)}$.

9 Claims, 5 Drawing Sheets

SEMICONDUCTOR DEVICE AND FIELD-EFFECT TRANSISTOR

BACKGROUND OF THE INVENTION

1. Field of the Invention

The present invention relates to a semiconductor device and a field-effect transistor.

2. Background Art

Nitride compound semiconductors have high dielectric breakdown field strength, high heat resistance, and high electron saturation drift velocity, and hence can be used to provide electronic devices capable of high temperature operation and high power operation, as compared to Si-based or GaAs-based devices.

Incidentally, manufacture of a field-effect transistor, a type of electronic device, requires forming a gate electrode that has a Schottky characteristic with respect to the nitride compound semiconductor.

It has been reported that a Schottky electrode made of Ni (nickel), Pd (palladium), Pt (platinum), etc. having a large work function can be used with an n-type nitride compound semiconductor to achieve good electrical characteristics. However, since these metals do not have a very high melting point, the electrode degrades during high temperature or high power operation which electronic devices employing a nitride compound semiconductor characteristically perform.

To address the above problems, a method is proposed for using metal nitride for an electrode (see, e.g., Japanese Patent Laid-Open No. 2000-196109).

The above publication discloses that materials such as WN and TiN have a Schottky characteristic. However, this publication does not clearly show a principle, a crystal structure of material, and a composition ratio, a ratio of nitrogen to metal, for achieving a good Schottky characteristic. Therefore, the above method fails to produce satisfactory results.

SUMMARY OF THE INVENTION

The present invention has been devised in view of the above problems. It is, therefore, an object of the present invention to provide a semiconductor device employing an electrode having good Schottky characteristics.

Another object of the present invention is to provide a field-effect transistor employing a gate electrode having good Schottky characteristics.

According to one aspect of the present invention, a semiconductor device comprises an n-type nitride compound semiconductor, and a Schottky electrode formed on the n-type nitride compound semiconductor. The Schottky electrode includes an electrode layer formed on the n-type nitride compound semiconductor. The electrode layer has a rock salt type structure formed of at least one selected from the group consisting of zirconium, hafnium, niobium, tantalum, molybdenum and tungsten, and at least one selected from nitrogen and carbon. A crystal plane of the n-type nitride compound semiconductor is in contact with a crystal plane of the electrode layer. The crystal plane of the n-type nitride compound semiconductor is a hexagonal (0001)-plane. The crystal plane of the electrode layer is (111)-oriented.

According to another aspect of the present invention, a semiconductor device comprises a p-type nitride compound semiconductor, and an ohmic electrode formed on the p-type nitride compound semiconductor. The ohmic electrode includes an electrode layer formed on the p-type nitride compound semiconductor. The electrode layer has a rock salt type structure formed of a carbide of at least one selected from the group consisting of zirconium, hafnium, niobium, tantalum, molybdenum, and tungsten.

According to other aspect of the present invention, a semiconductor device comprises a p-type nitride compound semiconductor, and an ohmic electrode formed on the p-type nitride compound semiconductor. The ohmic electrode includes an electrode layer formed on the p-type nitride compound semiconductor. The electrode layer has a rock salt type structure formed of a nitride of at least one selected from the group consisting of zirconium, hafnium, niobium, tantalum, molybdenum, and tungsten. A crystal plane of the p-type nitride compound semiconductor is in contact with a crystal plane of the electrode layer. The crystal plane of the p-type nitride compound semiconductor is a hexagonal (0001)-plane. The crystal plane of the electrode layer is (111)-oriented.

According to other aspect of the present invention, a semiconductor device comprises a silicon carbide semiconductor, and an electrode formed on the silicon carbide semiconductor. The electrode includes an electrode layer formed on the silicon carbide semiconductor. The electrode layer has a rock salt type structure formed of a carbide of at least one selected from the group consisting of zirconium, hafnium, niobium, tantalum, molybdenum, and tungsten.

According to other aspect of the present invention, a semiconductor device comprises a silicon carbide semiconductor, and an electrode formed on the silicon carbide semiconductor. The electrode includes an electrode layer formed on the silicon carbide semiconductor. The electrode layer has a rock salt type structure formed of a nitride of at least one selected from the group consisting of zirconium, hafnium, niobium, tantalum, molybdenum, and tungsten. A crystal plane of the silicon carbide semiconductor is in contact with a crystal plane of the electrode layer. The crystal plane of the silicon carbide semiconductor is a hexagonal (0001)-plane. The crystal plane of the electrode layer is (111)-oriented.

Other objects and advantages of the present invention will become apparent from the following description.

DETAILED DESCRIPTION OF THE PREFERRED EMBODIMENTS

First Embodiment

Figure 1A:
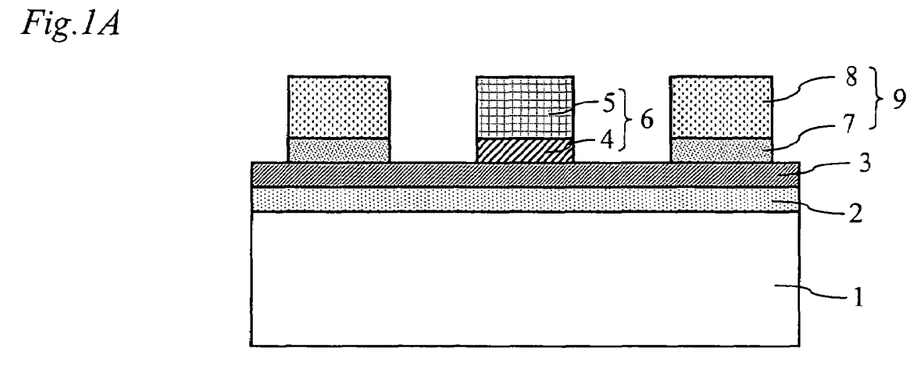
FIG. 1A is a cross-sectional view of a semiconductor device according to a first embodiment.
Figure 1B:
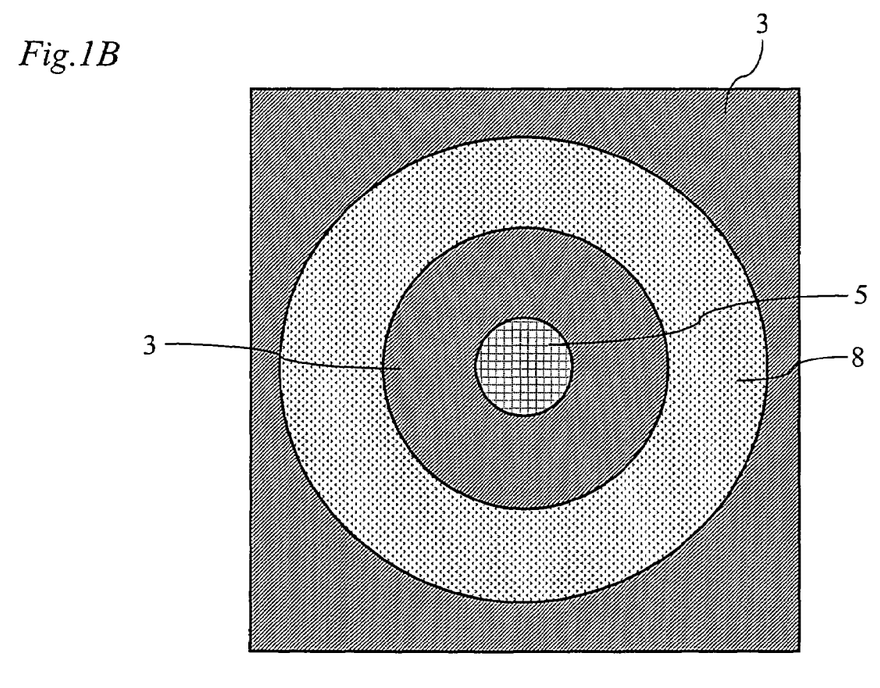
FIG. 1B is a plan view of a semiconductor device according to a first embodiment.

FIG. 1A is a cross-sectional view of a semiconductor device employing an electrode according to a first embodiment of the present invention, and FIG. 1B is a plan view of the semiconductor device shown in FIG. 1A.

In the example shown in FIGS. 1A and 1B, an i-type GaN (gallium nitride) layer 2 and an n-type GaN layer 3 are formed over a sapphire substrate 1 having the (0001) crystal plane orientation in that order. The i-type GaN layer 2 has a thickness of 2,200 nm, while the n-type GaN layer 3 has a thickness of 1,000 nm and a carrier concentration of $1\times10^{17}$ cm$^{-3}$. It should be noted that the n-type GaN layer 3 is an n-type nitride compound semiconductor of the present invention.

Further, on the n-type GaN layer 3 is formed a Schottky electrode 6 made up of a WNx (tungsten nitride) electrode layer 4 having a thickness of 50 nm and an Au (gold) electrode layer 5 having a thickness of 200 nm. According to the present embodiment, the ratio of nitrogen atoms to tungsten atoms (N/W) is preferably between 0.04 and 0.5.

It should be noted that instead of the Au layer 5, a different type of electrode layer may be formed on the WNx layer 4. Such an electrode layer may be predominantly composed of one or more elements selected from the group consisting of Au, Cu (copper), and Al (aluminum) and have a specific resistance of $5\times10^{-8}$ Om or less.

An ohmic electrode 9 made up of a Ti (titanium) layer 7 having a thickness of 20 nm and an Al layer 8 having a thickness of 500 nm is further formed on the n-type GaN layer 3 such that the ohmic electrode 9 encircles the Schottky electrode 6. It should be noted that the i-type GaN layer 2 and the n-type GaN layer 3 are hexagonal GaN and their crystal planes are (0001)-oriented.

The WNx layer 4 constituting the Schottky electrode 6 may be formed by a reactive sputtering method using W as a target and using a mixed gas that includes an inert gas such as Ar (argon), Kr (krypton), or Xe (xenon) and $N_2$ (nitrogen) gas. It should be noted that the WNx layer 4 may be formed by the chemical vapor deposition method, instead of the reactive sputtering method. This enables metallization into fine grooves.

Figure 2:
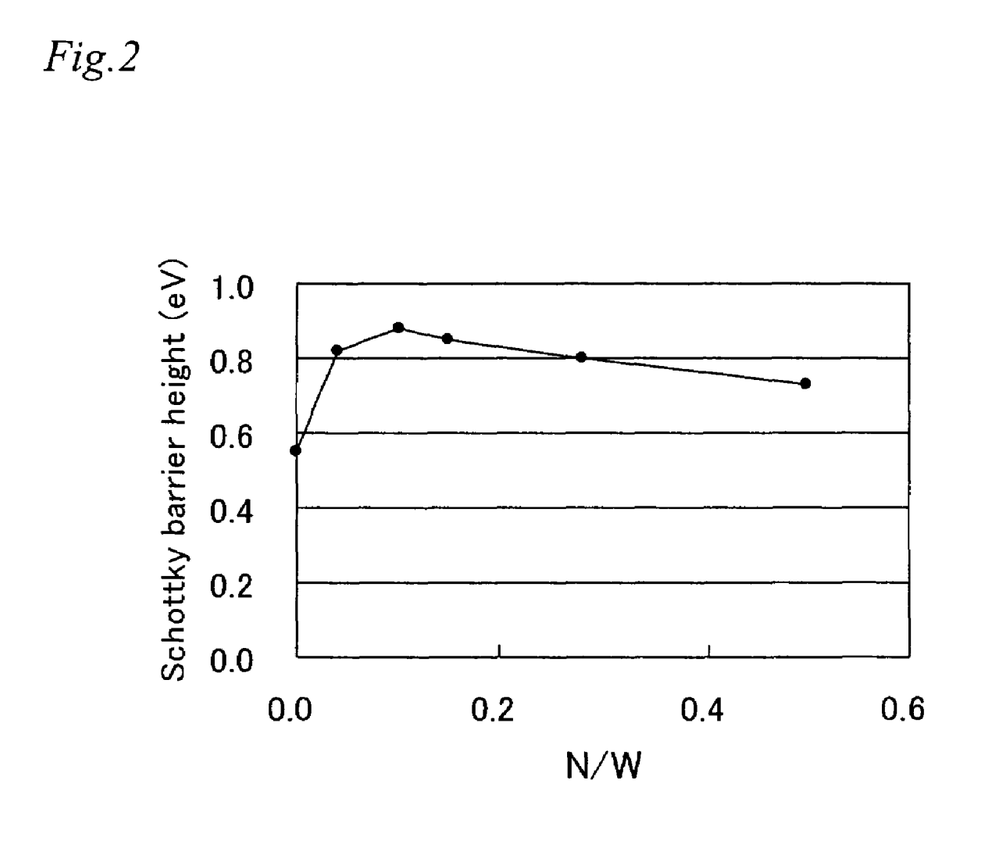
FIG. 2 shows a relationship between an N/W value and Schottky barrier height in a first embodiment.

FIG. 2 shows an exemplary relationship between the ratio of N atoms to W atoms (N/W) within the WNx film of a device and the Schottky barrier height FB. Each Schottky barrier height value was obtained based on the I-V (current vs. voltage) characteristics between the ohmic and Schottky electrodes of devices each including a WNx electrode formed under different reactive sputtering conditions. The ratio of N atoms to W atoms, on the other hand, was measured by photoelectron spectroscopy.

The Schottky barrier height FB was largest when the ratio (N/W) was 0.10, as shown in FIG. 2.

Table 1 shows the crystal structure, orientation, and lattice constant of each representative one of measured samples in which a WNx film having a thickness of 50 nm was formed on a GaN crystal having the (0001) crystal plane orientation. These characteristics were identified by x-ray diffraction spectrometry.

TABLE 1

| N/W | Schottky barrier height (eV) | Diffraction peak | Lattice constant (nm) |
|---|---|---|---|
| 0.04 | 0.82 | Not observed | — |
| 0.10 | 0.88 | (111)-oriented cubic (NaCl type) $W_2N$ | 0.421 |
| 0.15 | 0.85 | Hexagonal WN | — |
| 0.28 | 0.80 | Not observed | — |
| 0.50 | 0.73 | Not observed | — |

As can be seen from Table 1, a diffraction peak corresponding to an NaCl type cubic $W_2N$ (111)-plane was observed in the sample having an N/W value of 0.10. Further, this sample had a cubic $W_2N$ lattice constant of 0.421 nm, which was determined based on the angle of diffraction. On the other hand, the samples having N/W values of 0.04 or less exhibited no high diffraction peaks. Further, some of the samples having N/W values of 0.15 or more exhibited a diffraction peak due to hexagonal WN while the others did not exhibit any prominent diffraction peak. Thus, in these WNx Schottky electrodes formed on an n-type GaN crystal, the Schottky barrier height was largest when (111)-oriented NaCl type cubic $W_2N$ was formed.

Second embodiment

A semiconductor device of a second embodiment of the present invention has a different electrode structure than the semiconductor device of the first embodiment in that a TaNx layer is formed on an n-type GaN layer, instead of the WNx layer.

Figure 3:
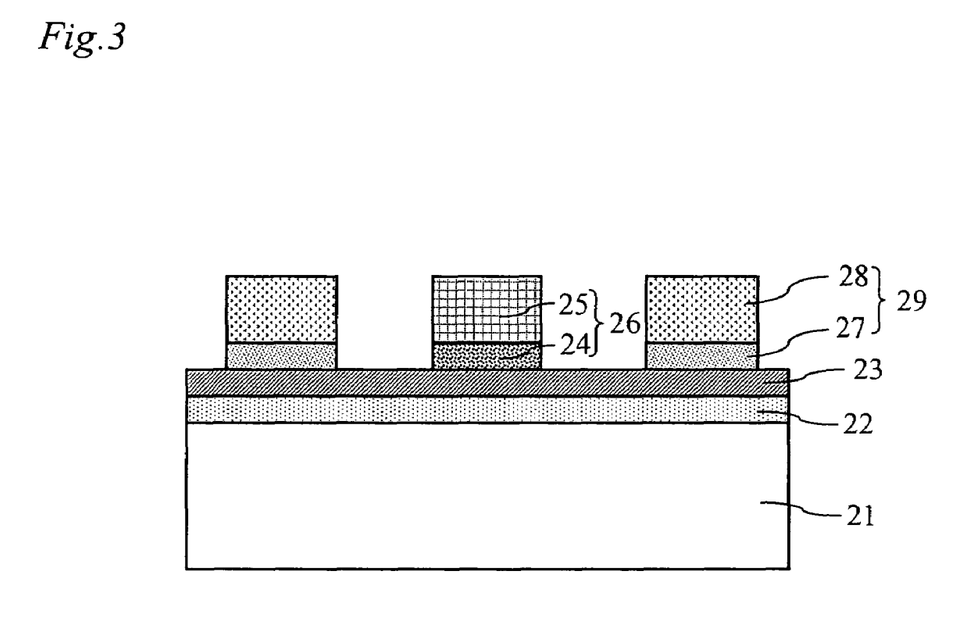
FIG. 3 is a cross-sectional view of a semiconductor device according to a second embodiment.

FIG. 3 is a cross-sectional view of a semiconductor device employing an electrode according to the present embodiment.

In the example shown in FIG. 3, an i-type GaN (gallium nitride) layer 22 and an n-type GaN layer 23 are formed over a sapphire substrate 21 having the (0001) crystal plane orientation in that order, as in FIG. 1A. It should be noted that the n-type GaN layer 23 is an n-type nitride compound semiconductor of the present invention.

Further, a Schottky electrode 26 made up of a TaNx (tantalum nitride) electrode layer 24 and an Au (gold) electrode layer 25 is formed on the n-type GaN layer 23. According to the present embodiment, the ratio of nitrogen atoms to tantalum atoms (N/Ta) is preferably between 0.5 and 1.2.

It should be noted that instead of the Au layer 25, a different type of electrode layer may be formed on the TaNx layer 24. Such an electrode layer may be predominantly composed of one or more elements selected from the group consisting of Au, Cu (copper), and Al (aluminum) and have a specific resistance of $5\times10^{-8}$ Om or less.

An ohmic electrode 29 made up of a Ti (titanium) layer 27 and an Al layer 28 is further formed on the n-type GaN layer 23 such that the ohmic electrode 29 encircles the Schottky electrode 26. It should be noted that the i-type GaN layer 22 and the n-type GaN layer 23 are hexagonal GaN and their crystal planes are (0001)-oriented.

The TaNx layer 24 constituting the Schottky electrode 26 may be formed by a reactive sputtering method using Ta as a target and using a mixed gas that includes an inert gas such as Ar (argon), Kr (krypton), or Xe (xenon) and $N_2$ (nitrogen) gas. It should be noted that the TaNx layer 24 may be formed by the chemical vapor deposition method, instead of the reactive sputtering method. This enables metallization into fine grooves.

Figure 4:
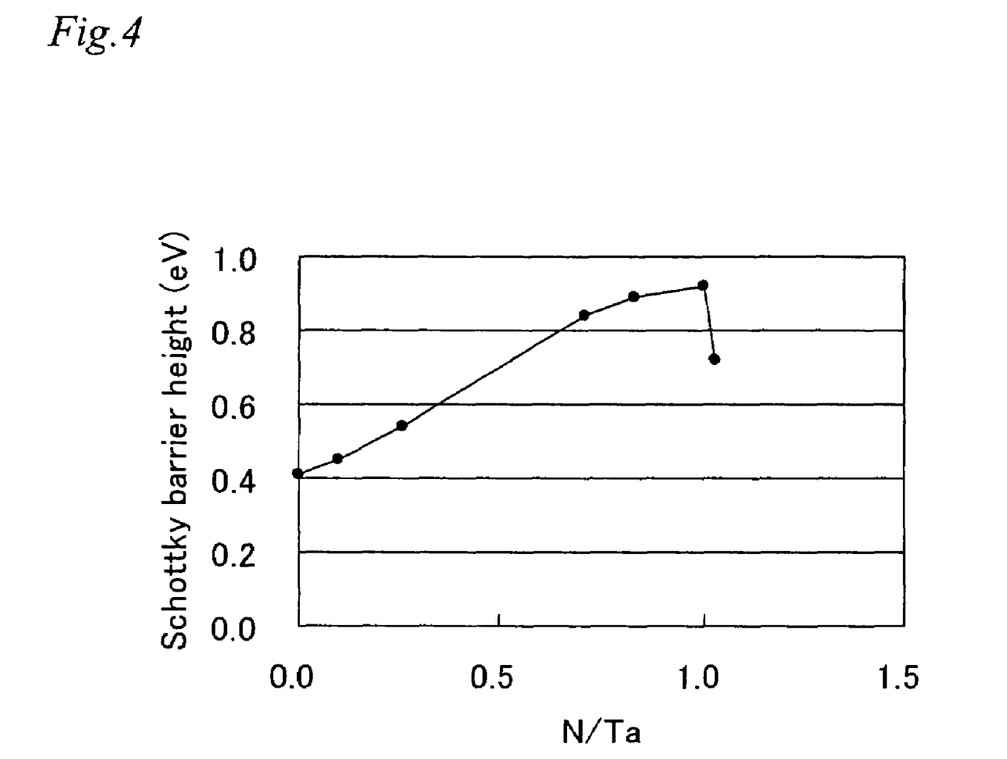
FIG. 4 shows a relationship between an N/W value and Schottky barrier height in a second embodiment.

FIG. 4 shows an exemplary relationship between the ratio of N atoms to Ta atoms (N/Ta) within the TaNx film of a device and the Schottky barrier height FB. Each Schottky barrier height value was obtained based on the I-V (current vs. voltage) characteristics between the ohmic and Schottky electrodes of devices each including a TaNx electrode formed under different reactive sputtering conditions. The ratio of N atoms to Ta atoms, on the other hand, was measured by photoelectron spectroscopy.

The Schottky barrier height FB was largest when the ratio (N/Ta) was 1.0, as shown in FIG. 4.

Table 2 shows the crystal structure, orientation, and lattice constant of each representative one of measured samples in which a TaNx film having a thickness of 50 nm was formed on a GaN crystal having the (0001) crystal plane orientation. These characteristics were identified by x-ray diffraction spectrometry.

TABLE 2

| N/Ta | Schottky barrier height (eV) | Diffraction peak | Lattice constant (nm) |
|---|---|---|---|
| 0.26 | 0.54 | Not observed | — |
| 0.71 | 0.84 | (111)-oriented cubic (NaCl type) TaN | 0.439 |
| 0.83 | 0.89 | (111)-oriented cubic (NaCl type) TaN | 0.445 |
| 1.00 | 0.92 | (111)-oriented cubic (NaCl type) TaN | 0.446 |
| 1.03 | 0.72 | Not observed | — |

As can be seen from Table 2, a diffraction peak corresponding to an NaCl type cubic TaN (111)-plane was observed in the samples having N/Ta values of 0.71 to 1.00. Further, those samples having N/Ta values of 0.71, 0.83, and 1.00 had cubic TaN lattice constants of 0.439 nm, 0.445 nm, and 0.446 nm, respectively.

Further, in these TaNx Schottky electrodes (formed on an n-type GaN crystal), the Schottky barrier height was largest when (111)-oriented NaCl type cubic TaN was formed and its lattice constant was close to $2^{(1/2)}$ times the a-axis lattice constant of hexagonal GaN (that is, close to $2^{(1/2)} \times 0.319$ nm=0.451 nm).

The above devices of the first and second embodiments have the following common characteristic. A large Schottky barrier height can be obtained when an NaCl type cubic nitride compound is formed and its crystal plane is (111)-oriented. This will be described in detail below.

Hexagonal GaN has a wurtzite type structure in which Ga and N atoms lie at the corners and center of regular hexagons with a side dimension of approximately 0.319 nm each on a c-plane, that is, a (0001)-plane.

On the other hand, $W_2N$ and TaN have an NaCl type crystal structure in which metal atoms lie at the corners and center of regular hexagons each on a (111)-plane. It should be noted that the side dimension of the regular hexagons, that is, the distance between two neighboring metal atoms, is $2^{-(1/2)}$ times the lattice constant a.

Specifically, in the $W_2N$ crystal of the first embodiment, the distance between two neighboring metal atoms is 0.298 nm. In the TaN crystal of the second embodiment, on the other hand, this distance is between 0.310 nm and 0.315 nm. Therefore, in both cases, the distance between two neighboring metal atoms is close to the distance between two closest neighboring atoms in the GaN crystal (i.e., 0.319 nm).

This implies that the periodic structures of the (111)-planes of $W_2N$ and TaN (which are NaCl type crystals) are equivalent to the periodic structure of the c-plane of hexagonal GaN. As a result, WNx and TaN, which have an NaCl type crystal structure, grow epitaxially on the (0001)-plane of the GaN underlayer when deposited. This allowed us to obtain $W_2N$ and TaN thin films having very high crystallinity and uniform crystal plane orientations, as described above. Formation of such a thin film is considered to be a factor in achieving a good Schottky interface.

Figure 5:
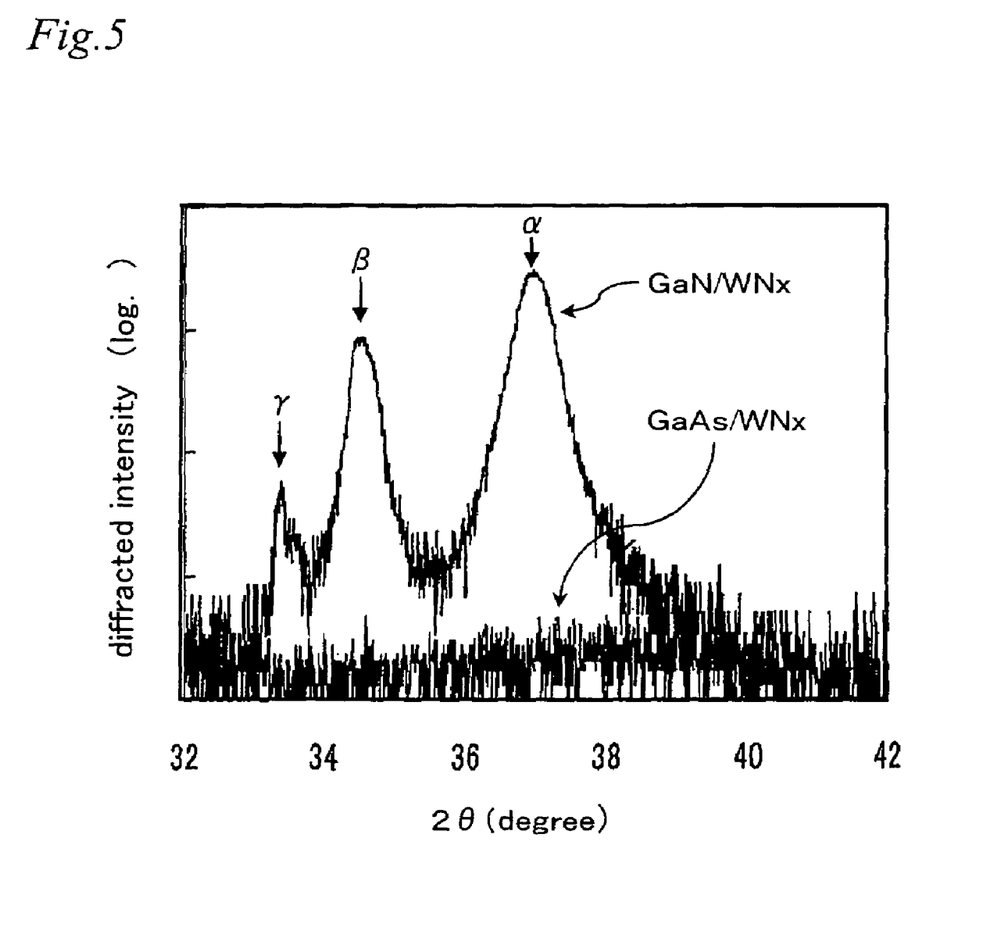
FIG. 5 shows x-ray diffraction spectral measurements of device samples having a WNx film on GaN or GaAs.

FIG. 5 shows x-ray diffraction spectral measurements of device samples in which a WNx film having an N/W value of 0.1 was formed on the (0001)-plane of GaN or (100)-plane of GaAs.

As can be seen from FIG. 5, a diffraction peak (indicated by α in the figure) corresponding to a $W_2N$ (111)-plane was observed in the sample in which a WNx film was formed on GaN. It should be noted that peaks β and α in FIG. 5 came from the substrate.

On the other hand, no peak was observed in the sample in which a WNx film was formed on GaAs even though the film forming conditions were the same. This is considered to be due to the fact that the periodic structure of the (100)-plane of GaAs is different from that of the (111)-plane of $W_2N$. That is, the reason why a WNx crystal having high crystallinity was formed on the (0001)-plane of GaN is that the periodic structure of the (0001)-plane of GaN is equivalent to that of the (111)-plane of $W_2N$.

Generally, the Schottky barrier height of an electrode formed on an n-type nitride compound semiconductor depends largely on the work function of the material of the electrode, as is known in the art. That is, the greater the work function, the higher the Schottky barrier height. Further, in an NaCl type crystal structure, the (111)-plane is considered to provide the greatest work function, since the atomic density is highest in this plane. This may be another reason why the above electrodes formed according to the first and second embodiments exhibited good Schottky characteristics.

Although the first and second embodiments use $W_2N$ and TaN as electrode material, the present invention is not limited to these particular materials. Specifically, according to the present invention, the electrode layer may be made of any material having a rock salt type structure formed of nitrogen or carbon or both and one or more elements selected from the group consisting of Zr (zirconium), Hf (hafnium), Nb (niobium), Ta (tantalum), Mo (molybdenum), and W (tungsten). It should be noted that the crystal plane of the n-type GaN layer and the crystal plane of the electrode layer that are in contact with each other are preferably such that the crystal plane of the n-type GaN layer is a hexagonal (0001)-plane and the crystal plane of the electrode layer is (111)-oriented.

Each of Zr, Hf, Nb, Ta, Mo, and W, which are transition metals belonging to Group IVa to Group VIa of the Periodic Table, forms a compound with nitrogen and carbon, and many of these elements have an NaCl type structure. Literature values for the lattice constants of those having an NaCl type structure are 0.41 nm to 0.47 nm. This means that their interatomic distances in the (111)-plane are 0.29 nm to 0.33 nm. Therefore, as in the first and second embodiments, a film of one of the above elements may be formed on the (0001)-plane of GaN such that the film has an NaCl crystal structure and is (111)-oriented, which allows the film to have high crystallinity. As a result, it is possible to form an electrode having a large Schottky barrier height with respect to n-type GaN.

Incidentally, the interatomic distance in the (111)-plane of an NaCl type crystal is equal to that in the (0001)-plane of GaN when the lattice constant of the NaCl type structure is 0.451 nm (i.e., $2^{(1/2)} \times 0.319$ nm). On the other hand, literature values for the lattice constants of the $W_2N$ crystal and TaN crystal are 0.4126 nm and 0.4340 nm, respectively, which are smaller than 0.451 nm. Even when there is such a difference in interatomic distance, the above thin films formed on GaN exhibit high crystallinity. However, the difference between these interatomic distances may be further reduced to enhance the crystallinity of the crystal and reduce residual stress.

Further, literature values for the lattice constants of HfN and TaC having an NaCl type crystal structure are 0.4525 nm and 0.4455 nm, respectively. This means that the interatomic distances in the (111)-planes of these crystals are closer to the interatomic distance in the (0001)-plane of GaN than those in the (111)-planes of $W_2N$ and TaN. Therefore, an HfN film or a TaC film formed on the (0001)-plane of GaN has high quality and a high degree of orientation with few defects, as compared to $W_2N$ and TaN films.

According to the present invention, the lattice constant of an electrode layer formed on an n-type nitride compound semiconductor is preferably 0.95 to 1.05 times the a-axis lattice constant of the n-type nitride compound semiconductor multiplied by $2^{(1/2)}$.

Further according to the present invention, a material whose interatomic distance is substantially equal to the interatomic distance in the (0001)-plane of GaN can be obtained by using a mixture of two or more types of metal elements or by mixing nitrogen and carbon with a metal and optimizing their ratio. Further, a material whose coefficient of thermal expansion is close to that of GaN may be selected to reduce residual stress, prevent degradation of the electrode material in the device manufacturing process, and reduce the variation in the device characteristics due to the temperature history of the device, that depends on the use environment.

As is clear from the above discussion, by using the Schottky electrode of the first or second embodiment as a gate electrode and a nitride compound semiconductor as an active layer, it is possible to provide a field-effect transistor having good electrical characteristics.

The materials having a large Schottky barrier height described in connection with the present invention are expected to form a good ohmic junction with a p-type nitride compound semiconductor. Therefore, these materials may be used as ohmic electrodes on a p-type nitride compound semiconductor in a light emitting device, such as a semiconductor laser, or a bipolar transistor, which allows the electrodes to have good electrical characteristics and high reliability.

Specifically, the present invention also provides a semiconductor device comprising: a p-type nitride compound semiconductor; and an ohmic electrode formed on the p-type nitride compound semiconductor; wherein the ohmic electrode includes an electrode layer formed on the p-type nitride compound, the electrode layer having a rock salt type structure formed of a carbide of one or more elements selected from the group consisting of Zr (zirconium), Hf (hafnium), Nb (niobium), Ta (tantalum), Mo (molybdenum), and W (tungsten). In this case, the crystal plane of the p-type nitride compound semiconductor and the crystal plane of the electrode layer that are in contact with each other are preferably such that the crystal plane of the p-type nitride compound semiconductor is a hexagonal (0001)-plane and the crystal plane of the electrode layer is (111)-oriented.

Further, the present invention also provides a semiconductor device comprising: a p-type nitride compound semiconductor; and an ohmic electrode formed on the p-type nitride compound semiconductor; wherein the ohmic electrode includes an electrode layer formed on the p-type nitride compound semiconductor, the electrode layer having a rock salt type structure formed of a nitride of one or more elements selected from the group consisting Zr (zirconium), Hf (hafnium), Nb (niobium), Ta (tantalum), Mo (molybdenum), and W (tungsten). Also in this case, the crystal plane of the p-type nitride compound semiconductor and the crystal plane of the electrode layer that are in contact with each other are preferably such that the crystal plane of the p-type nitride compound semiconductor is a hexagonal (0001)-plane and the crystal plane of the electrode layer is (111)-oriented.

Incidentally, the c-plane of hexagonal silicon carbide (6H—SiC, etc.) has the same structure as hexagonal GaN, and the length of the a-axis is approximately 0.31 nm. Therefore, an electrode formed of one of the above materials may be formed on such a silicon carbide to achieve high crystallinity.

Specifically, the present invention also provides a semiconductor device comprising: a silicon carbide semiconductor; and an electrode formed on the silicon carbide semiconductor; wherein the electrode includes an electrode layer formed on the silicon carbide semiconductor, the electrode layer having a rock salt type structure formed of a carbide of one or more elements selected from the group consisting of Zr (zirconium), Hf (hafnium), Nb (niobium), Ta (tantalum), Mo (molybdenum), and W (tungsten). In this case, the crystal plane of the silicon carbide semiconductor and the crystal plane of the electrode layer that are in contact with each other are preferably such that the crystal plane of the silicon carbide semiconductor is a hexagonal (0001)-plane and the crystal plane of the electrode layer is (111)-oriented.

Further, the present invention also provides a semiconductor device comprising: a silicon carbide semiconductor; and an electrode formed on the silicon carbide semiconductor; wherein the electrode includes an electrode layer formed on the silicon carbide semiconductor, the electrode layer having a rock salt type structure formed of a nitride of one or more elements selected from the group consisting of Zr (zirconium), Hf (hafnium), Nb (niobium), Ta (tantalum), Mo (molybdenum), and W (tungsten). Also in this case, the crystal plane of the silicon carbide semiconductor and the crystal plane of the electrode layer that are in contact with each other are preferably such that the crystal plane of the silicon carbide semiconductor is a hexagonal (0001)-plane and the crystal plane of the electrode layer is (111)-oriented.

The features and advantages of the present invention may be summarized as follows.

As described above, a semiconductor device of the present invention is configured such that: a Schottky electrode is formed on an n-type nitride compound semiconductor; the Schottky electrode includes an electrode layer formed on the n-type nitride compound semiconductor, the electrode layer having a rock salt type structure formed of nitrogen or carbon or both and one or more elements selected from the group consisting of zirconium, hafnium, niobium, tantalum, molybdenum, and tungsten; and the crystal plane of the n-type nitride compound semiconductor and the crystal plane of the electrode layer that are in contact with each other are such that the crystal plane of the n-type nitride compound semiconductor is a hexagonal (0001)-plane and the crystal plane of the electrode layer is (111)-oriented. This arrangement allows the electrode of the semiconductor device to have good Schottky characteristics.

Further according to the present invention, the above Schottky electrode may be used as a gate electrode to provide a field-effect transistor having good electrical characteristics.

Another semiconductor device of the present invention is configured such that: an ohmic electrode is formed on a p-type nitride compound semiconductor; and the ohmic electrode includes an electrode layer formed on the p-type nitride compound semiconductor, the electrode layer having a rock salt type structure formed of a carbide of one or more elements selected from the group consisting of zirconium, hafnium, niobium, tantalum, molybdenum, and tungsten. This arrangement allows the electrode of the semiconductor device to have good ohmic characteristics.

Still another semiconductor device of the present invention is configured such that: an ohmic electrode is formed on a p-type nitride compound semiconductor; the ohmic electrode includes an electrode layer formed on the p-type nitride compound semiconductor, the electrode layer having a rock salt type structure formed of a nitride of one or more elements selected from the group consisting of zirconium, hafnium, niobium, tantalum, molybdenum, and tungsten; and the crystal plane of the p-type nitride compound semiconductor and the crystal plane of the electrode layer that are in contact with each other are such that the crystal plane of the p-type nitride compound semiconductor is a hexagonal (0001)-plane and the crystal plane of the electrode layer is (111)-oriented. This arrangement also allows the electrode of the semiconductor device to have good ohmic characteristics.

Yet another semiconductor device of the present invention is configured such that: an electrode is formed on a silicon carbide semiconductor; and the electrode includes an electrode layer formed on the silicon carbide semiconductor, the electrode layer having a rock salt type structure formed of a carbide of one or more elements selected from the group consisting of zirconium, hafnium, niobium, tantalum, molybdenum, and tungsten. This arrangement allows the electrode of the semiconductor device to have good electrical characteristics.

Yet another semiconductor device of the present invention is configured such that: an electrode is formed on a silicon carbide semiconductor; the electrode includes an electrode layer formed on the silicon carbide semiconductor, the electrode layer having a rock salt type structure formed of a nitride of one or more elements selected from the group consisting of zirconium, hafnium, niobium, tantalum, molybdenum, and tungsten; and the crystal plane of the silicon carbide semiconductor and the crystal plane of the electrode layer that are in contact with each other are such that the crystal plane of the silicon carbide semiconductor is a hexagonal (0001)-plane and the crystal plane of the electrode layer is (111)-oriented. This arrangement also allows the electrode of the semiconductor device to have good electrical characteristics.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-000481, filed on Jan. 5, 2005 including specification, claims, drawings and summary, on which the Convention priority of the present application is based, are incorporated herein by reference in its entirety.

What is claimed is:

1. A semiconductor device comprising:
    an n-type nitride compound semiconductor; and
    a Schottky electrode on said n-type nitride compound semiconductor, wherein
        said Schottky electrode includes a first electrode layer on said n-type nitride compound semiconductor, said first electrode layer having an NaCl-type structure including at least one metal selected from the group consisting of zirconium, hafnium, niobium, tantalum, molybdenum and tungsten, and at least one element selected from nitrogen and carbon, and
        a crystal plane of said n-type nitride compound semiconductor is in contact with a crystal plane of said first electrode layer, said crystal plane of said n-type nitride compound semiconductor being a (0001) plane, and said crystal plane of said first electrode layer being (111)-oriented.

2. The semiconductor device according to claim 1, wherein said first electrode layer is a tungsten nitride layer having a ratio of nitrogen atoms to tungsten atoms between 0.04 and 0.5.

3. The semiconductor device according to claim 1, wherein said first electrode layer is a tantalum nitride layer having a ratio of nitrogen atoms to tantalum atoms between 0.5 and 1.2.

4. The semiconductor device according to claim 1, wherein the lattice constant of said first electrode layer is 0.95 to 1.05 times the a-axis lattice constant of said n-type nitride compound semiconductor, multiplied by $2^{(1/2)}$.

5. The semiconductor device according to claim 1, wherein said Schottky electrode further includes a second electrode layer on said first electrode layer, said second electrode layer having a specific resistance of $5\times10^{-8}$ Ωm or less and being predominantly composed of at least one metal selected from the group consisting of gold, copper, and aluminum.

6. A field-effect transistor comprising:
    a gate electrode including the Schottky electrode according to claim 1; and
    an active layer of a nitride compound semiconductor.

7. A semiconductor device comprising:
    a p-type nitride compound semiconductor; and
    an ohmic electrode on said p-type nitride compound semiconductor, wherein said ohmic electrode includes an electrode layer on said p-type nitride compound semiconductor, said electrode layer having an NaCl-type structure including a carbide of at least one metal selected from the group consisting of zirconium, hafnium, niobium, tantalum, molybdenum, and tungsten.

8. A semiconductor device comprising:
    a p-type nitride compound semiconductor; and
    an ohmic electrode formed on said p-type nitride compound semiconductor, wherein
        said ohmic electrode includes an electrode layer on said p-type nitride compound semiconductor, said electrode layer having an NaCl-type structure including a nitride of at least one metal selected from the group consisting of zirconium, hafnium, niobium, tantalum, molybdenum, and tungsten, and
    a crystal plane of said p-type nitride compound semiconductor is in contact with a crystal plane of said electrode layer, said crystal plane of said p-type nitride compound semiconductor being a (0001) plane, and said crystal plane of said electrode layer being (111)-oriented.

9. A semiconductor device comprising:
    a silicon carbide semiconductor; and
    an electrode on said silicon carbide semiconductor, wherein
        said electrode includes an electrode layer on said silicon carbide semiconductor, said electrode layer having an NaCl-type structure including a nitride of at least one metal selected from the group consisting of zirconium, hafnium, niobium, tantalum, molybdenum, and tungsten, and
    a crystal plane of said silicon carbide semiconductor is in contact with a crystal plane of said electrode layer, said crystal plane of said silicon carbide semiconductor being a (0001) plane, and said crystal plane of said electrode layer being (111)-oriented.

* * * * *